United States Patent [19]
Iwamoto

[11] Patent Number: 6,100,124
[45] Date of Patent: Aug. 8, 2000

[54] METHOD FOR MANUFACTURING A BICMOS SEMICONDUCTOR DEVICE

[75] Inventor: Yasuhiko Iwamoto, Tokyo, Japan

[73] Assignee: NEC Corporation, Tokyo, Japan

[21] Appl. No.: 09/132,661

[22] Filed: Aug. 12, 1998

[30] Foreign Application Priority Data

Aug. 12, 1997 [JP] Japan .................................. 9-217855

[51] Int. Cl.$^7$ .............................................. H01L 21/8238
[52] U.S. Cl. ........................ 438/202; 438/761; 438/763; 438/309
[58] Field of Search .................................. 438/199, 200, 438/202, 234, 314, 758, 761, 763, 309

[56] References Cited

U.S. PATENT DOCUMENTS

| | | | |
|---|---|---|---|
| 4,983,531 | 1/1991 | Consetino | 438/202 |
| 5,192,992 | 3/1993 | Kim et al. | 257/370 |
| 5,411,900 | 5/1995 | Nagel | 438/202 |
| 5,500,392 | 3/1996 | Reynolds et al. | 438/401 |
| 5,516,718 | 5/1996 | Lee | 437/59 |
| 5,614,430 | 3/1997 | Liang et al. | 438/291 |
| 5,681,765 | 10/1997 | Darmawan | 438/586 |
| 5,710,454 | 1/1998 | Wu | 257/413 |

FOREIGN PATENT DOCUMENTS

| | | |
|---|---|---|
| 1-2028551 | 8/1989 | Japan . |
| 5-145025 | 6/1993 | Japan . |

OTHER PUBLICATIONS

E.D. Johnson et al, A High–Performance 0.5$\mu$m BiCMOS Technology with 3. 3–V CMOS Devices, Symposium on VLSI Technology, 1990, pp. 89–90.

Primary Examiner—John F. Niebling
Assistant Examiner—Christopher Lattin
Attorney, Agent, or Firm—Foley & Lardner

[57] ABSTRACT

In a method for manufacturing a BiCMOS semiconductor device including bipolar transistors and MOS transistors, a thin gate oxide film is formed on a principal surface of a semiconductor substrate, and a first polysilicon film is formed on the thin gate oxide film. This first polysilicon film is selectively removed from a bipolar transistor formation area, and impurities are introduced into a principal surface region of a semiconductor substrate through only the thin gate oxide film so that a collector region is formed in the semiconductor substrate in the bipolar transistor formation area, and a base region is formed in the collector region, Therefore, a second polysilicon film is formed on the whole surface, and the second polysilicon film and the underlying thin gate oxide film are removed from an emitter formation area within the base region. A third polysilicon film having a high impurity concentration is formed on the whole surface, and thereafter, the polysilicon layers are patterned to form a gate composed of the first, second and third polysilicon films, and an emitter composed of the second and third polysilicon films. The impurity included in the third polysilicon is thermally diffused in the base region so that an emitter region is formed in the base region. Thus, without increasing the number of masks, and without giving an adverse influence to the MOS transistor, the performance of the bipolar transistor can be elevated, and the stable yield of production can be realized. In addition, the microminiaturization of the bipolar transistor becomes possible

11 Claims, 10 Drawing Sheets

METHOD FOR MANUFACTURING A BICMOS SEMICONDUCTOR DEVICE

BACKGROUND OF THE INVENTION

1. Field of the Invention

The present invention relates to a method for manufacturing a semiconductor device, and more specifically to a method for manufacturing a BiCMOS semiconductor device including bipolar transistors and MOS transistors.

2. Description of Related Art

For a BiCMOS semiconductor device including bipolar transistors and MOS transistors formed in a mixed condition on the same substrate, various manufacturing methods have been proposed in the prior art.

Here, with reference to the drawings, two examples of the prior art generic manufacturing methods will be described (a first one of which will be called a "first prior art method" and a second one of which will be called a "second prior art method", hereinafter).

First Prior Art Method

FIGS. 3A to 3D are diagrammatic sectional views of a semiconductor device for illustrating the first prior art method for manufacturing the BiCMOS semiconductor device.

In the first prior art method, as shown in FIG. 3A, after an insulator film 2 for a device isolation is formed in a predetermined area on a semiconductor substrate 1 (of for example a P-type) 1, first, a collector region 3, a base region 5 and an $n^+$ region 4 of a high impurity concentration for leading out the collector region 3, are formed in the semiconductor substrate 1, and then, a P-well 7 arid an N-well (not shown) are formed.

Thereafter, an insulating film 6 is formed on the whole surface of the semiconductor substrate 1. This insulating film 6 will become a gate oxide film, and is formed by a thermal oxidation.

Then, as shown in FIG. 3B, a first polysilicon film 8 is formed on the whole surface of the semiconductor substrate 1, and by a phlotolithography using a photoresist (not shown), an opening is formed to penetrate through the first polysilicon film 8 and two insulating film 6 at a predetermined position above the base region 5 so as to expose a portion of the base region 5. Succeedingly, a second polysilicon film 9 is formed on the whole surface including the opening thus formed, and an n-type impurity (for example, As) is introduced into the second polysilicon film 9.

Thereafter, the second polysilicon film 9 of the n type and the first polysilicon film 8 are patterned to be left in only respective predetermined areas of a MOS transistor formation area and a bipolar transistor formation area, so that a gate and an emitter are constituted.

Furthermore, sidewall insulator films 10 and another insulating film 11 are formed as shown in FIG. 3C, and then, $p^-$ regions (not shown) and $p^+$ regions (not shown) which constitute source/drain regions of a pMOS transistor and $n^-$ regions 13 and $n^+$ regions 12 which constitute source/drain regions of an nMOS transistor are formed. In addition, a $p^+$ region 14 constituting a graft base of the bipolar transistor and an $n^+$ region 15 constituting a collector leading-out region are formed.

Then, a heat treatment is conducted under an appropriate condition so that an emitter 32 is formed, as shown in FIG. 3D.

Succeedingly, a silicide film 33 is formed on the surface of the semiconductor substrate 1, and thereafter, an interlayer insulator 16 is formed. Contact holes arc formed at predetermined positions to penetrate through the interlayer insulator 16, and filled up with a conductive material if necessary, so that a source electrode 26. a drain electrode 27, a base electrode 28, an emitter electrode 29 ad a collector electrode 30 are formed at predetermined positions, respectively. Thus, a BiCMOS semiconductor device is formed.

Second Prior Art Method

FIGS. 4A to 4C are diagrammatic sectional views of a semiconductor device for illustrating the second prior art method for manufacturing the BiCMOS semiconductor device. In FIGS. 4A to 4C, elements similar to those shown in FIGS. 3A to 3D are given the same Reference Numerals, and explanation thereof will be omitted for simplification of the description.

In the second prior art method, as shown in FIG. 4A, after an insulator film 2 for a device isolation is formed in a predetermined area on a semiconductor substrate 1 (of for example a P-type) 1, an $n^+$ region 4 of a high impurity concentration for leading out a collector region is formed in the semiconductor substrate 1, and then, an N-well (not shown) and a P-well 7 are formed.

Thereafter, an insulating film 6 is formed on the whole surface of the semiconductor substrate 1, and furthermore, a first polysilicon film 8 is formed on the whole surface of the insulating film 6. as shown in FIG. 4A.

Then, as shown in FIG. 4B, by using a photoresist (not shown) as a mask, a collector region 3 and a base region 5 of an NPN transistor are formed in predetermnied areas.

Furthermore, as shown in FIG. 4C, by a photolithography using a photoresist (not shown), an opening is formed to penetrate through the first polysilicon film 8 and the insulating film 6 at a predetermined position above the base region 5 so as to expose a portion of the base region 5. Succeedingly, a second polysilicon film 9 is formed on the whole surface including the opening thus formed, and an n-type impurity (for example, As) is introduced into the second polysilicon film 9.

Thereafter, the second polysilicon film 9 of the n type and the first polysilicon film 8 are patterned to be left in only respective predetermined areas of a MOS transistor formation area and a bipolar transistor formation area, so that a gate and an emitter are constituted. Incidentally, the step shown in FIG. 4C is the same as the step shown in FIG. 3B in the first prior art method.

After the step shown in FIG. 4C, the step shown in FIG. 3C in the first prior art method is carried out, so that the BiCMOS semiconductor device shown in FIG. 3D in the first prior are method is formed.

Incidentally, the above mentioned first and second prior art methods are different in that the first prior art method is characterized by folding the insulating film 6 (becoming the gate oxide film) after the base region 5 is formed (namely, by carrying out a thermal oxidation for formation of the gate oxide film of the MOS transistor after the base region 5 of the bipolar transistor is formed), and on the other hand, the second prior art method is characterized by forming the base region 5 after the insulating film 6 (becoming the gate oxide film) is formed (namely, by forming the base region 5 after the thermal oxidation for formation of the gate oxide film).

In addition, the second prior art method is different from the first prior method in that, after the first polysilicon film 8 is formed, the base region 5 is formed in order to protect the gate oxide film of the MOS transistors. In the other regards, both of the methods are composed of the same steps.

In the prior art methods for manufacturing the BiCMOS semiconductor device, exemplified by the above mentioned first and second prior art methods, the following various problems have been encountered.

A first problem is that: As in the above mentioned first and second prior art methods, since the prior art method for manufacturing the BiCMOS semiconductor device is constituted by incorporating a process for manufacturing a bipolar transistor into a process for manufacturing a MOS transistor, it is necessary to add masks and forming steps, so that the number of masks and steps are increased and the whole process becomes complicated.

The reason for this is that: The MOS transistor has been simplified for the purpose of reducing the cost, and incorporation of the bipolar transistor manufacturing process into the process for manufacturing a standard MOS transistor, results in a substantially difficult problem. For example, if it is attempted to incorporate the bipolar transistor manufacturing process into the standard MOS transistor manufacturing process, it is necessary to add masks and forming steps.

The number of added masks and steps has a relation to the performance of the device to be added. Although which of the bipolar transistor and the MOS transistor is added is dependent upon the purpose of the addition, if it is attempted to ensure the performance of both the devices, both of the number of added masks and the number of added forming steps will increase correspondingly.

A second problem is that in the above mentioned first prior art method, after the base region 5 of the bipolar transistor is formed, the insulating film 6 constituting the gate oxide film of the MOS transistor is formed, but the BiCMOS transistor manufactured by this method cannot have a high performance bipolar transistor.

The reason for this is that: Since in the first prior are method the insulating film 6 constituting the gate oxide film of the MOS transistor is formed after the base region 5 of the bipolar transistor is formed, the surface impurity or carrier concentration of the base region of the bipolar transistor remarkably drops because of the thermal oxidation for formation of the gate oxide film, as shown in, FIGS. 5A and 5B, with the result that a collector-emitter breakdown voltage remarkably drops.

FIGS. 5A and 5B are graphs showing the relation between the carrier concentration and the depth measured from the base region surface in the first prior art method in which the thermal oxidation for formation of the gate oxide film is carried out after the base region is formed. FIG. 5A illustrates the carrier concentration profile just after the doping for forming the base region is completed, and FIG. 5B illustrates the carrier concentration profile just after the thermal oxidation for forming the gate oxide film is completed. In FIGS. 5A and 5B. and in succeeding FIGS. 6 and 7, the carrier concentration is expressed by logarithms of the carrier concentration to the base ten (log base 10 of the carrier number per $cm^3$). Therefore, in these figures, for example, "19" means $10^{19} cm^{-3}$. From comparison between FIGS. 5A and 5B, it would be seen that the surface concentration of the base region remarkably drops because of the thermal oxidation for formation of the gate oxide film.

In order to avoid the drop of the surface carrier concentration of the base region, it may be considered to enlarge the thickness of the base region in a vertical direction, namely, in a base region depth direction. However, this becomes a fatal problem in a technical approach of elevating the performance of the bipolar transistor by forming a shallow junction.

A third problem is that the first prior art method cannot realize a microminiaturization. The reason for this it that the drop of the collector-emitter breakdown voltage is more remarkable in an edge portion of the base region (namely, a junction portion between the base region and the insulator film for the device isolation), and therefore, it is necessary to make a distance between the emitter and the device isolation insulator film larger than a certain minimum distance, with the result that the microminiaturization is restricted by the minimum distance which must be ensured between the emitter and the device isolation insulator film. If this minimum distance between the emitter and the device isolation insulator film is not ensured, the yield of production remarkably drops because of the drop of the breakdown voltage.

In order to avoid the above problems, it has been known to form the base region after the thermal oxidation for formation of the gate oxide film, as in the second prior art method. In the second prior art method, however, in order to protect the gate oxide film for the MOS transistor, it is necessary to form the collector region 3 and the base region 5 after the first polysilicon film 8 is formed, as in the step shown in FIG. 4B. For this purpose, it is also necessary to increase an energy for an ion implantation, with the result that the base thickness in the vertical direction inevitably becomes large, as shown in FIG. 7, and therefore, a high performance bipolar transistor cannot be obtained.

FIG. 7 is a graph showing the relation between the carrier concentration and the depth measured from the base region surface in the second prior art method in which the base region is formed after the first polysilicon film is formed. From the base impurity concentration profile shown in FIG. 7. it would be understood that the base thickness (in the depth direction of the base region) is increased because of a high energy ion implantation.

SUMMARY OF THE INVENTION

Accordingly, it is an object of the present invention to provide a BiCMOS manufacturing method which has overcome the above mentioned first to third problems of the first and second prior art methods.

Another object of the present invention is to provide a BiCMOS manufacturing method capable of forming a bipolar transistor having an elevated performance, without increasing the number of masks, without giving an adverse influence to a MOS transistor, and with a stable yield of production.

Still another object of the present invention is to provide a BiCMOS manufacturing method capable of forming a bipolar transistor and a MOS transistor, having a stable characteristics and an elevated reliability, without deteriorating the performance of the bipolar transistor.

The above and other objects of the present invention are achieved in accordance with the present invention by a method for manufacturing a BiCMOS semiconductor device including bipolar transistors and MOS transistors, including the steps of:

(1) selectively forming a device isolation insulator film on a semiconductor substrate of a first conductivity type;

(2) selectively forming in the semiconductor substrate a region of a second conductivity type opposite to the first conductivity type and having a high impurity concentration so as to form a collector leading-out region of a bipolar transistor;

(3) foxing in the semiconductor substrate a first well of the first conductivity type and a second well of the second conductivity type for a MOS transistor;

(4) forming an insulating film on the whole surface of the semiconductor substrate including the first well and the second well, and also forming a first polysilicon film on the insulating film;

(5) selectively removing the first polysilicon film in a bipolar transistor formation area;

(6) forming a first region of the second conductivity type in the semiconductor substrate in the bipolar transistor formation area;

(7) forming a second region of the first conductivity type in the first region of the second conductivity type;

(8) forming a second polysilicon film on the whole surface of the semiconductor substrate including the first polysilicon film and the second region of the first conductivity type;

(9) selectively removing the second polysilicon film and the insulating film above the second region of the first conductivity type, to form an opening exposing a predetermined area of the second region of the first conductivity type;

(10) forming a third polysilicon film including impurity of the second conductivity type, on the whole surface of the semiconductor substrate including the opening; and

(11) selectively removing the first, second and third polysilicon films so that the first, second and third polysilicon films are selectively left as a gate in a predetermined area of each of the first well and the second well, and the second and third polysilicon films are selectively left as an emitter in the opening formed in the overdetermined area of the second region of the first conductivity type.

The third polysilicon film including impurity of the second conductivity type, can be formed by forming a non-doped third polysilicon film on the whole surface of the semiconductor substrate including the opening, and introducing impurity of the second conductivity type into the third polysilicon film, or alternatively by depositing a polysilicon including impurity of the second conductivity type, on the whole surface of the semiconductor substrate including the opening, so that the third polysilicon film including the impurity of the second conductivity type is formed on the whole surface of the semiconductor substrate including the opening.

In the step (7), the second region of the first conductivity type (the base region) can be formed by introducing impurity of the first conductivity type, for example, "B" or "$BF_2$", into a surface region of the first region of the second conductivity type. In the step (10), the impurity of the second conductivity type introduced into the third polysilicon film is P (phosphorus) or As (arsenic).

More specifically, if the method of the present invention is applied for manufacturing a BiCMOS semiconductor device in a p-type semiconductor substrate, first, after a device isolation insulator film, a collector leading-out $n^+$ region of a bipolar transistor, and a well for a MOS transistor are formed, a gate oxide film is formed oil the p-type semiconductor substrate, and then, a first polysilicon film is formed on the gate oxide film. Succeedingly, the first polysilicon film is selectively removed from only a bipolar transistor formation area, and a collector region and a base region are formed in the p-type semiconductor substrate, by introducing respective impurities through only the gate oxide film. Thereafter, a second polysilicon film is formed on the whole surface of the semiconductor substrate, and then, the second polysilicon film and the insulating film are selectively removed from a predetermined area above the base region to form an opening exposing the predetermined area of the base region. Furthermore a third polysilicon film doped with n-type impurity is formed on the whole surface, and then, the first, second and third polysilicon films are patterned so as to form a gate formed of the first, second and third polysilicon films and an emitter formed of the second and third polysilicon films.

In the above mentioned method in accordance with the present invention, after the oxidation for formation of the gate oxide film, the base region can be formed by introducing impurity through only the gate oxide film. In addition, the bipolar transistor can be incorporated into a MOS process with adding no mask.

Furthermore, this can be realized without deteriorating the performance of the bipolar transistor, and the performance and the yield of production can be elevated in comparison with the prior art methods.

The above mentioned method in accordance with the present invention is characterized in that the first polysilicon film is selectively removed from only the bipolar transistor formation area, and the base region is formed by introducing the impurity through only the gate oxide film, differently from the above mentioned second prior art method (in which the base region is formed after the first polysilicon layer is formed). Therefore, since a high energy ion implantation is not required for formation of the base region, the thickness of the base region in never enlarged in a vertical direction, namely, in a base region depth direction, differently from the above mentioned second prior art method, and as seen from FIG. 6, which is a graph showing the relation between the carrier concentration and the depth measured from the base region surface in the BiCMOS semiconductor device manufactured in accordance with the method of the present invention, and which illustrates a base impurity concentration profile. As seen from comparison between FIG. 6 and FIG. 7 (which illustrates the base impurity concentration profile in the BiCMOS semiconductor device manufactured in accordance with the second prior art method), it would be understood that the thickness of the base region in the base region depth direction is not enlarged in accordance with the method of the present invention.

The above and other objects features and advantages of the present invention will be apparent from the following description of preferred embodiments of the invention with reference to the accompanying drawings.

DESCRIPTION OF THE PREFERRED EMBODIMENTS

Figure 1A:
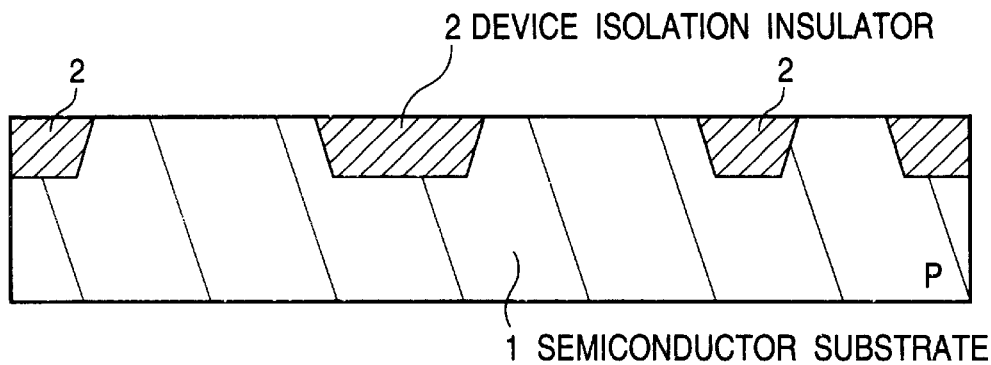
FIGS. 1A to 1I are diagrammatic sectional views of a semiconductor device for illustrating a first embodiment of the method in accordance with the present invention for manufacturing the BiCMOS semiconductor device.

Now, embodiments of the method in accordance with the present invention for manufacturing the BiCMOS semiconductor device will be described with reference to the accompanying drawings.

Fist Embodiment

A first embodiment of the method in accordance with the present invention for manufacturing the BiCMOS semiconductor device will be described with reference to FIGS. 1A to 1I, which are diagrammatic sectional views of a semiconductor device for illustrating the first embodiment of the method in accordance with the present invention for manufacturing the BiCMOS semiconductor device. In FIGS. 1A to 1I, elements similar to those shown in FIGS. 3A to 3D are given the same Reference Numerals.

First, as shown in FIG. 1A, a device isolation insulator film (field oxide film) 2 is selectively formed on a principal surface of a semiconductor substrate 1, which is a p-type semiconductor substrate. Here, it is sufficient if this insulator film 2 has a thickness of about 5000 Å.

Figure 1B:
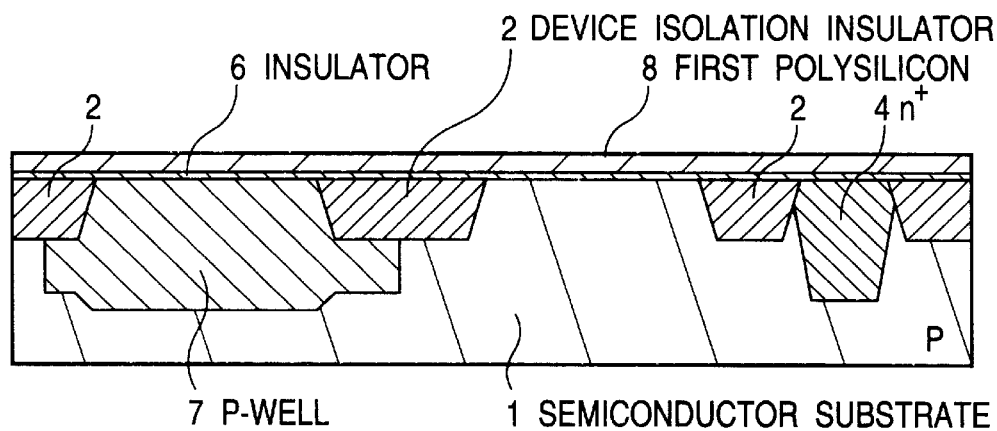

Then, as shown in FIG. 1B, an n⁺ region 4 (which will become a collector leading-out high impurity concentration region for a bipolar transistor), a P-well 7 for an nMOS transistor, and an N-well (not shown) for a pMOS transistor, are formed in respective predetermnied surface regions of a semiconductor substrate 1, by for example an ion-implantation and, if necessary, a heat treatment.

Subsequently, an insulating film 6 (which will become a gate insulator film of the MOS transistor) is formed on the whole of the principal surface of the semiconductor substrate. This insulating film 6 is formed by a thermal oxidation, to have a film thickness on the order of 100 Å to 160 Å. Furthermore, a first non-doped polysilicon film 8 is formed on the whole surface of the insulating film 6. This first polysilicon film 8 is intended to protect the insulating film 6 (becoming the gate insulator film of the MOS transistor) from a removal of a photoresist deposited in a later step and from other processes performed in later steps, and therefore, it is sufficient if the first polysilicon film 8 has a film thickness on the order of 500 Å to 1000 Å.

Figure 1C:
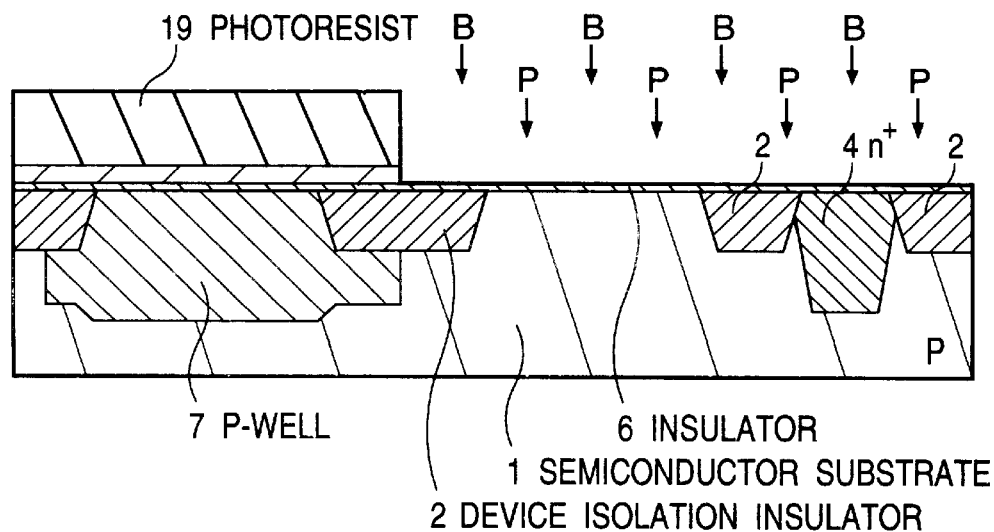

Thereafter, as shown in FIG. 1C, a patterned photoresist film 19 is formed to cover the surface other than a bipolar transistor formation area, and the first polysilicon film 8 is selectively removed from only the bipolar transistor formation area to form an opening exposing the insulating film 6 in the bipolar transistor formation area.

Here, the first polysilicon film 8 can be easily etched by using an anisotropic etching, On the other hand, since a collector region and a base region will be formed by ion implantation in later steps, it is necessary to leave the insulating film 6 (becoming the gate insulator film of the MOS transistor). Accordingly, an etching selection ratio of the polysilicon 8 to the insulating film 6 must be sufficiently large. For example, this selection ratio is preferred to be larger than 100.

Figure 1D:
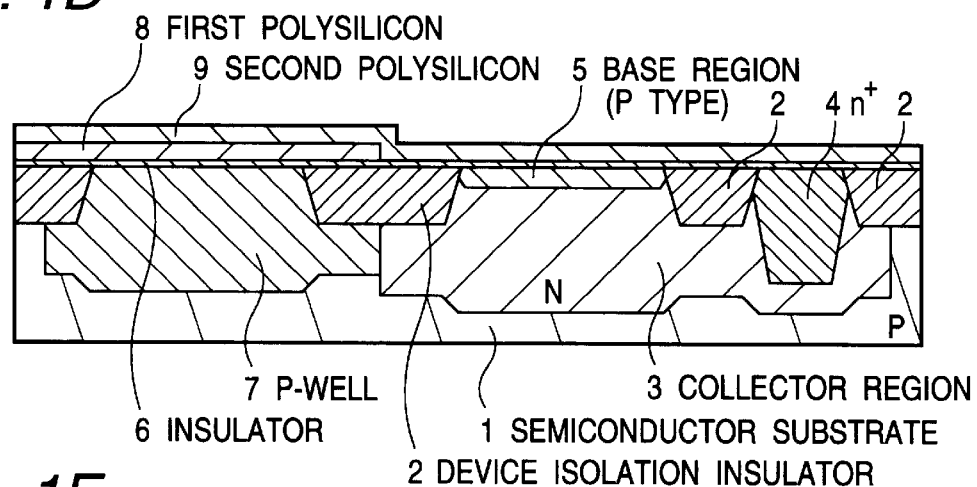

After the first polysilicon film 8 is selectively removed, ions of an n-type impurity (for example, P (phosphorus)) and ions of a p-type impurity (for example, B (boron)) are implanted as shown in FIG. 1C, so as to form a collector region 3 and a base region 5 as shown in FIG. 1D.

Specifically, first, in order to form the collector region 3, for example, P ions are ion-implanted with an acceleration energy of 700 KeV to 2000 KeV and a dose of $1.0 \times 10^{13}/cm^2$ to $9.0 \times 10^{13}/cm^2$, and if necessary, a annealing is carried out. This condition for the ion implantation is actually determined in accordance with a required emitter-collector breakdown voltage.

On the other hand, in order to form the base region 5 in the collector region 3, for example, B ions are ion-implanted with an acceleration energy of 10 KeV to 30 KeV and a dose of $1.0 \times 10^{13}/cm^2$ to $5.0 \times 10^{13}/cm^2$. In this process, although the p-type impurities are introduced into the n⁺ region 4 (which will become the collector leading-out region of the high impurity concentration), since the concentration of the n-type impurity in the n⁺ region 4 is sufficiently higher than the concentration of the p-type iniquity, there is no problem. Here, as the p-type impurity, "$BF_2$" ions can be used in place of the B ions.

Thereafter, the photoresist film 19 is removed, and as shown in FIG. 1D, a second non-doped polysilicon film 9 is formed on the whole principal surface of the semiconductor substrate including the collector region 3 and the base region 5. Since this second polysilicon film 9 will be patterned to constitute a mask for forming an emitter region in the base region, the second polysilicon film 9 is preferred to have a film thickness of 500 Å to 1000 Å or more.

Figure 1E:
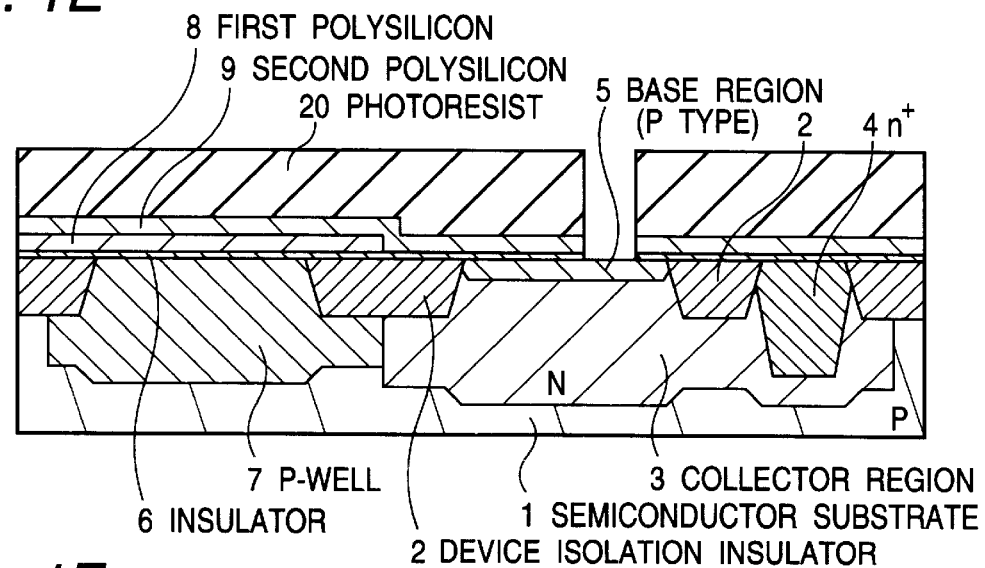

Subsequently, as shown in FIG. 1E, another patterned photoresist film 20 is formed on the second polysilicon film 9, and by using the patterned photoresist film 20 as a mask, the second polysilicon film 9 is selectively removed from a predetermined area (an emitter formation area) within the base region 5 to form an opening exposing the insulating film 6 in the predetermined area within the base region 5.

For formation of the opening exposing the insulating film 6 in the predetermined area within the base region 5, an anisotropic etching can be used. In this case, it is necessary that an etching is stopped at the insulating film 6, in order to prevent damage attributable to the anisotropic etching. Because, if a defect occurs because of the damage, a leakage occurs in the device. Therefore, an etching selection ratio of the polysilicon film 9 to the insulating film 6 must be sufficiently high. For example, this selection ratio is preferred to be larger than 100.

Thereafter, a pre-processing using for example a hydrofluoric acid (HF) is conducted to remove the insulating film 6 remaining in the opening exposing the predetermined area within the base region 5, as shown in FIG. 1E. Then, the patterned photoresist film 20 is removed and further, a third non-doped polysilicon film 21 is formed on the whole principal surface of the semiconductor substrate 1 including the opening exposing the predetermined area within the base region 5.

Here, an insulation between the base region and an emitter region is achieved by only the insulating film 6, and therefore, the insulating film 6 in the bipolar transistor formation area is never allowed to be deteriorated in the above mentioned pre-processing. For the purpose of preventing the deterioration of the insulating film 6 in the bipolar transistor formation area, the second polysilicon film 9 is required to have the film thickness of 500 Å to 1000 Å or more, as mentioned above.

On the other hand, the film thickness of the third polysilicon film 21 is arbitrary. It is sufficient if each of the gate and the emitter has a total thickness of 1500 Å to 3000 Å.

In this embodiment, each of the gate and the emitter will be formed of only the polysilicon. However, each of the gate and the emitter is in no way limited to only the polysilicon, and for example, a metal such, as refractory metal exemplified by tungsten or tungsten silicide can be formed on the third polysilicon film 21.

Figure 1F:
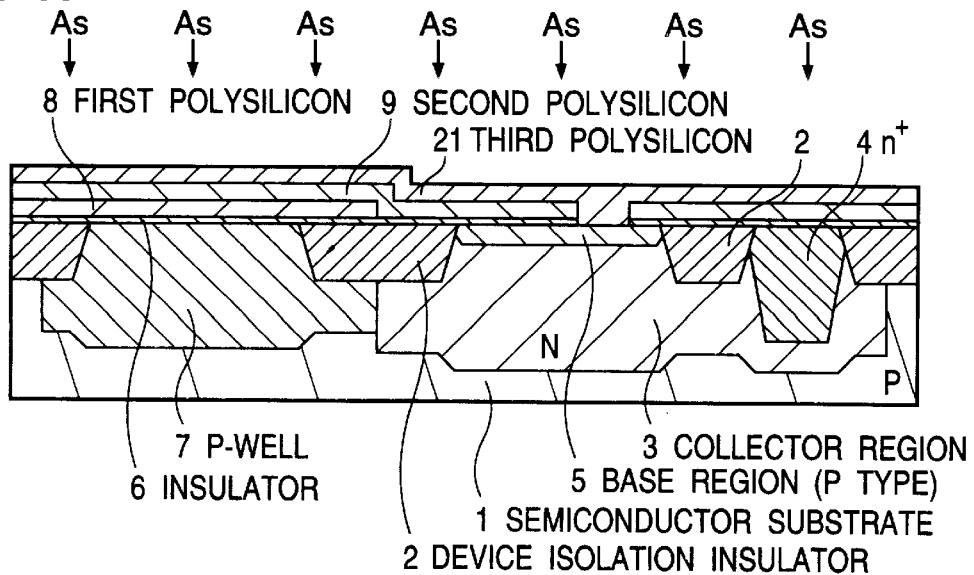

Thereafter, as shown in FIG. 1F, n-type impurity (for example, As) is ion-implanted into the third polysilicon film 21.

For example, the ion-implantation condition is preferably that an acceleration energy is on the order of 30 KeV to 70 KeV and a dose is on the order of $1.0 \times 10^{15}/m^2$ to $1.0 \times 10^{16}/cm^2$.

Figure 1G:
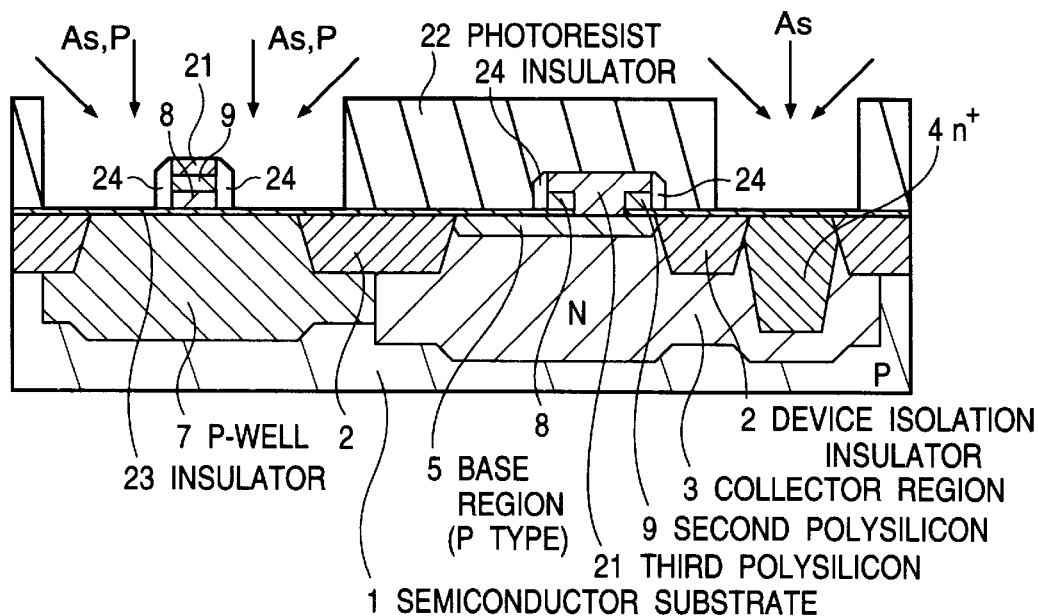

Then, as shown in FIG. 1G, the first, second and third polysilicon layers 8, 9 and 21 are patterned to form a gate for the MOS transistor and an emitter for the bipolar transistor. Furthermore, an insulating film is formed on the whole principal surface of the semiconductor substrate including the gate for the MOS transistor and the emitter for the bipolar transistor, and then, the same insulating film is etched back is to form a sidewall insulator film 24 on a side surface of the gate for the MOS transistor and on a side surface of the emitter for the bipolar transistor, as also shown in FIG. 1G. Here, it is sufficient if this insulating film has a film thickness on the order of 1000 Å to 2000 Å.

In addition, since in this etching-back process the insulating film 6 is removed from the exposed surface which are not covered with the gate having the sidewall insulator film 24 and the emitter having sidewall insulator film 24, a new insulating film 23 is formed on the exposed surface, as also shown in FIG. 1G. This new insulating film 23 is sufficient if it has a film thickness on the order of 100 Å to 300 Å. The insulating film 23 may be formed of either a thermal oxidation film or a CVD (chemical vapor deposition) film.

Figure 1H:
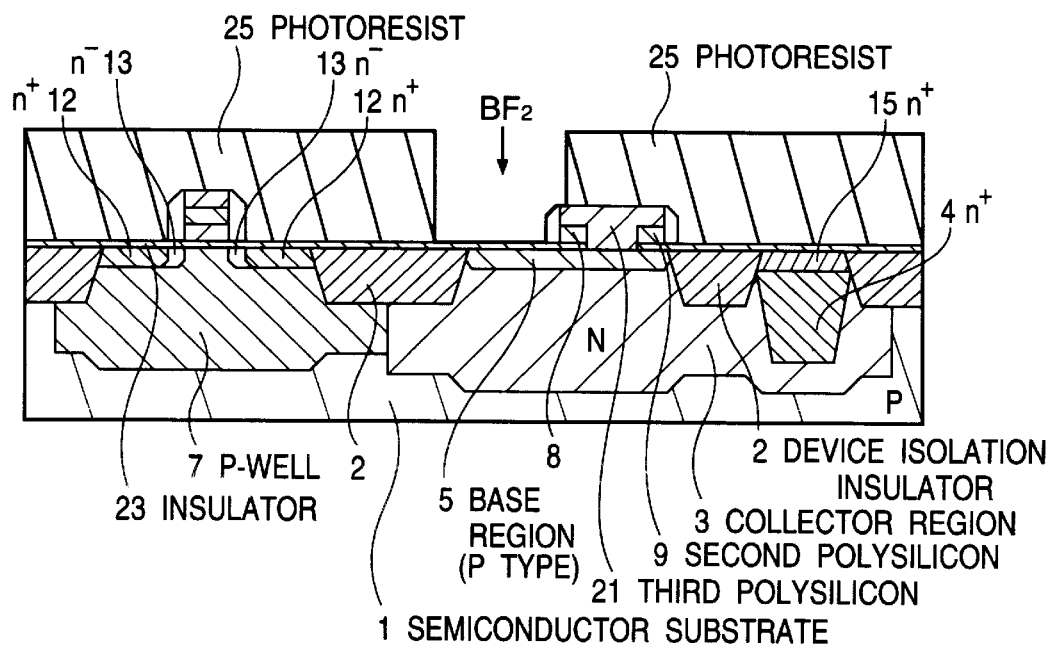

Furthermore, as also shown in FIG. 1G, a patterned photoresist layer 22 is formed, which selectively exposes only a source region and a drain region of the nMOS transistor and the collector leading-out region of the bipolar transistor, and then, an ion-implantation is carried out to form n$^+$ regions 12 and n$^-$ regions 13 for source/drain regions of the nMOS transistor, and an n$^+$ region 15 of the collector leading-out region of the bipolar transistor, as shown in FIG. 1H. At this time, As or P is used as the impurity for the ion-implantation. It is necessary that the acceleration energy and the dose of this ion-implantation are determined by putting a weight on the characteristics of the nMOS transistor.

Figure 1I:
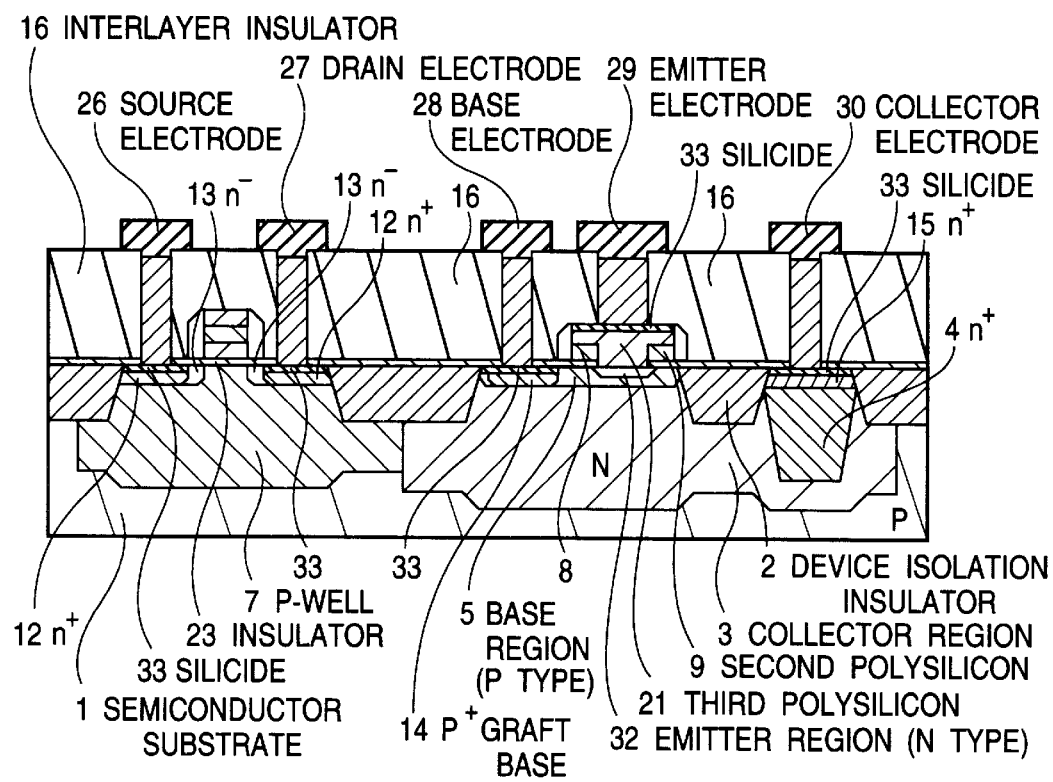

Then, the photoresist layer 22 is removed, and as also shown in FIG. 1H, another patterned photoresist layer 25 is formed, which selectively exposes only a source region and a drain region of the pMOS transistor (not shown) and a graft base region of the bipolar transistor, and then, an ion-implantation is carried out to form p$^+$ regions (not shown) and p$^-$ regions (not shown) for source/drain regions of the pMOS transistor, and a p$^+$ region 14 which constitutes a graft base region of the bipolar transistor, as shown in FIG. 1I. At this time, BF$_2$ is ordinarily used as the impurity for the ion-implantation. Similarly, it is necessary that the acceleration energy and the dose of this ion-implantation are determined by putting a weight on the characteristics of the pMOS transistor.

Thereafter, by considering the condition for the ion implantation and/or required performance, an appropriate heat treatment is carried out to cause impurity included in the patterned third polysilicon film 21 to thermally diffuse into the base region 5 so that an emitter region 32 is formed at a surface region of the base region 5, as also shown in FIG. 1I.

Subsequently, as also shown in FIG. 1I, a silicide layer 33 is formed on the surface of each of the source region (n$^+$ region 12) and the drain region (n$^+$ region 12) of the MOS transistor, the graft base region (p$^+$ region 14), the emitter (third polysilicon 21 above the emitter region 32) and the collector leading-out region (n$^+$ region 15) of the bipolar transistor.

After an interlayer insulator film 16 is formed on the whole surface, contact holes are formed to penetrate through the interlayer insulator film 16 at predetermined positions of the MOS transistor and the bipolar transistor, respectively, and then filed with a conductive material to form connection pillars, on which there are formed a source electrode 26, a drain electrode 27, a gate electrode (not shown), a base electrode 28, an emitter electrode 29 and a collector electrode 30, respectively, as also shown in FIG. 1I. Thus, a BiCMOS semiconductor device is obtained.

Second Embodiment

Figure 2A:
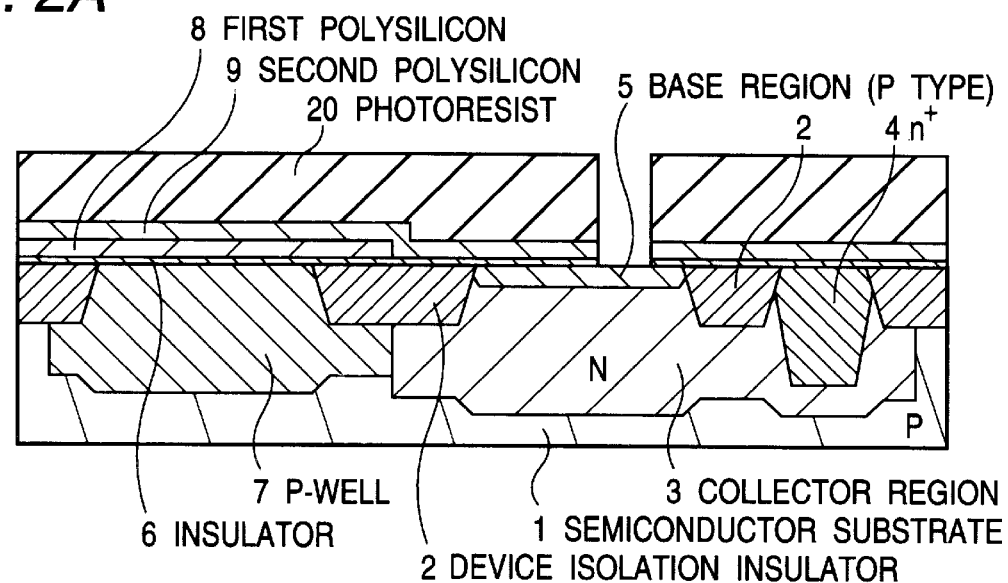
FIGS. 2A and 2B are diagrammatic sectional views of a semiconductor device for illustrating a portion of a second embodiment of the method in accordance with the present invention for manufacturing the BiCMOS semiconductor device.
Figure 2B:
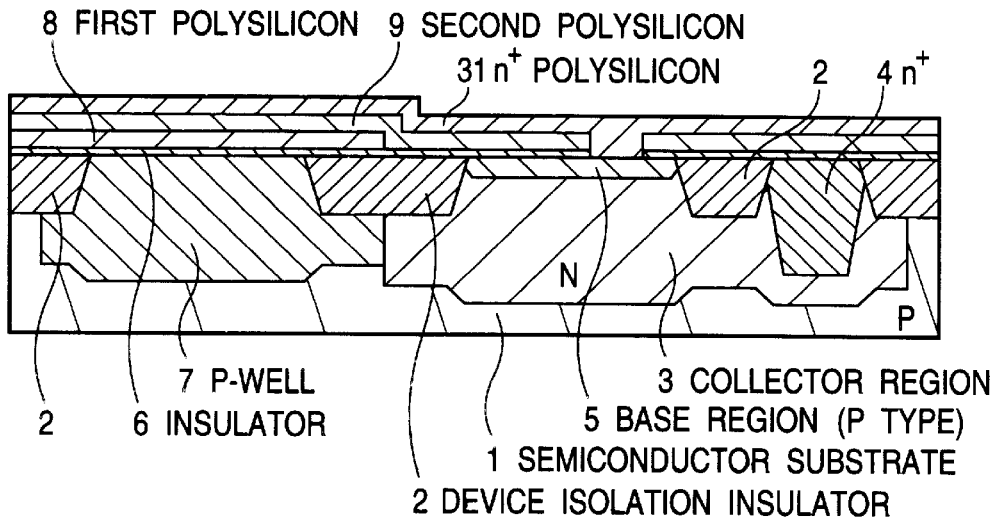
Figure 3A:
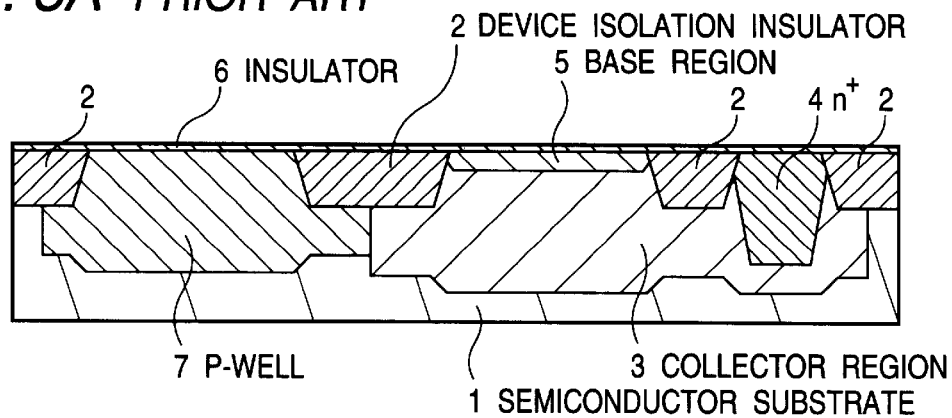
FIGS. 3A to 3D are diagrammatic sectional views of a semiconductor device for illustrating the first prior art method for manufacturing the BiCMOS semiconductor device.
Figure 3B:
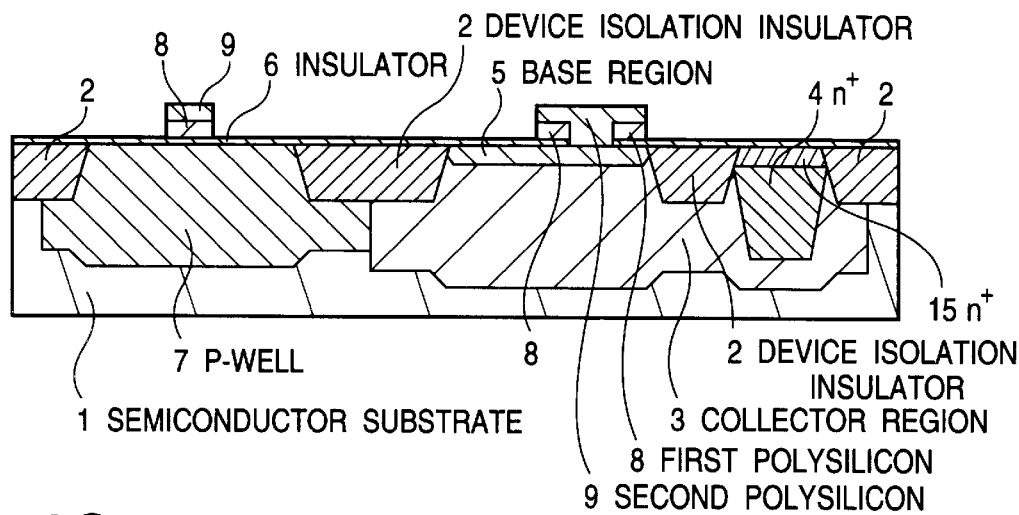
Figure 3C:
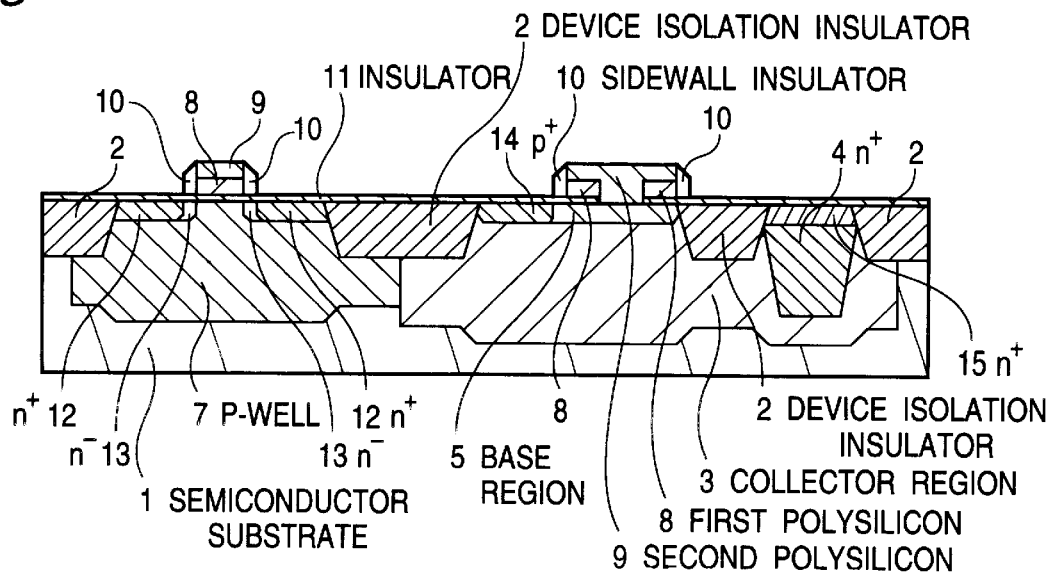
Figure 3D:
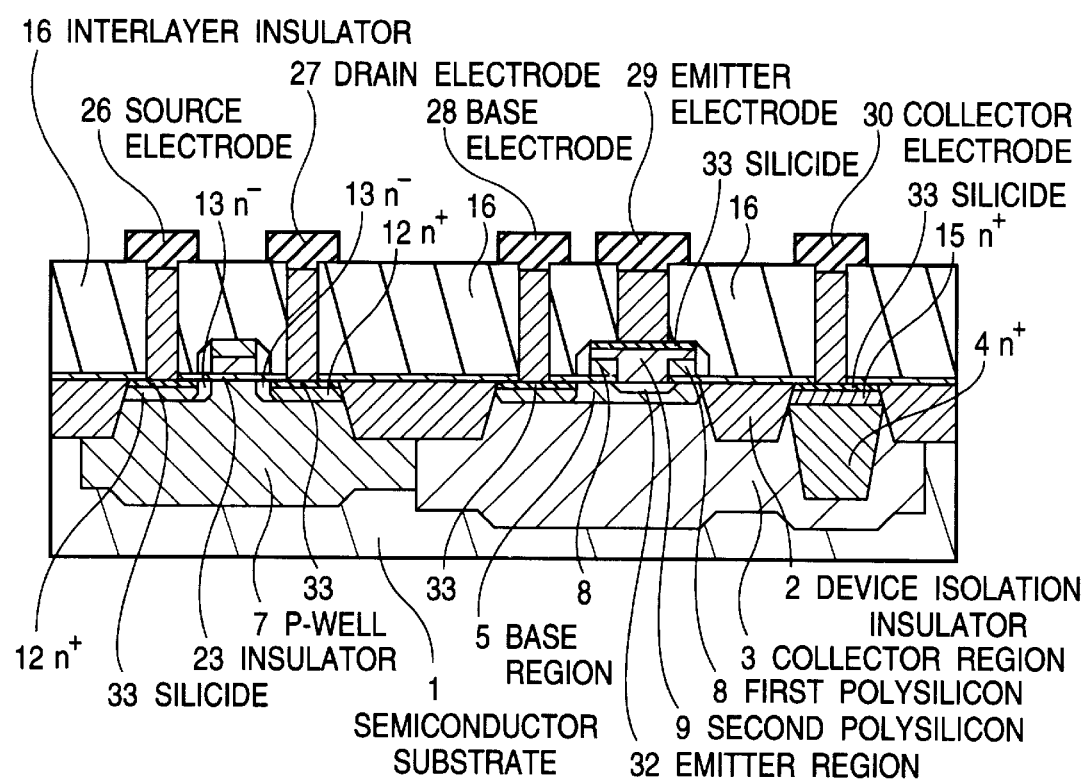
Figure 4A:
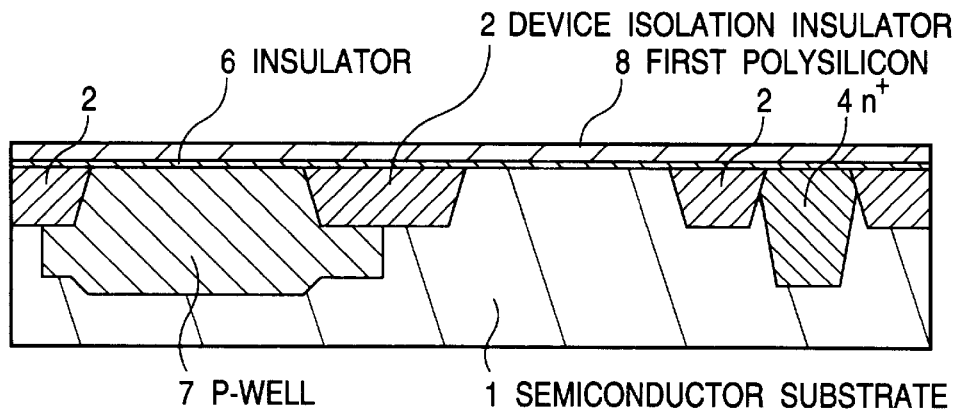
FIGS. 4A to 4C are diagrammatic sectional views of a semiconductor device for illustrating the second prior art method for manufacturing the BiCMOS semiconductor device.
Figure 4B:
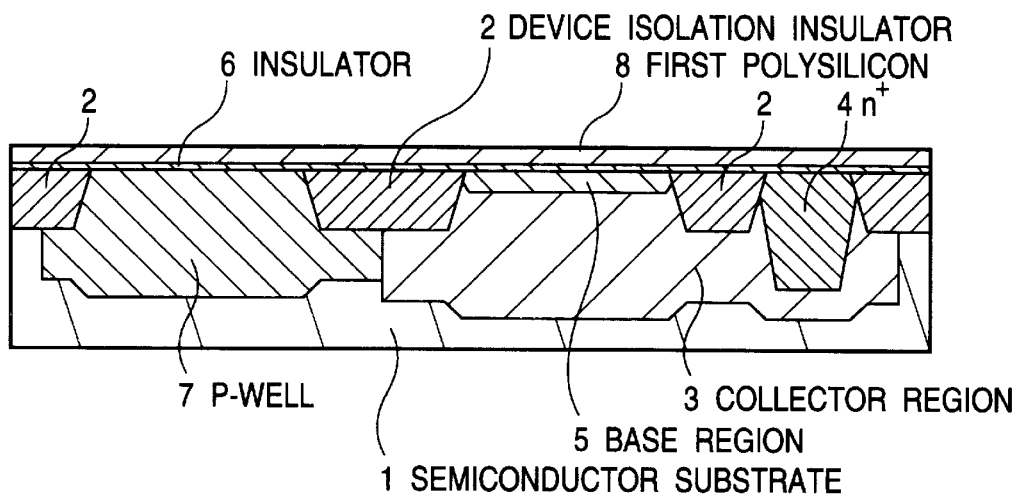
Figure 4C:
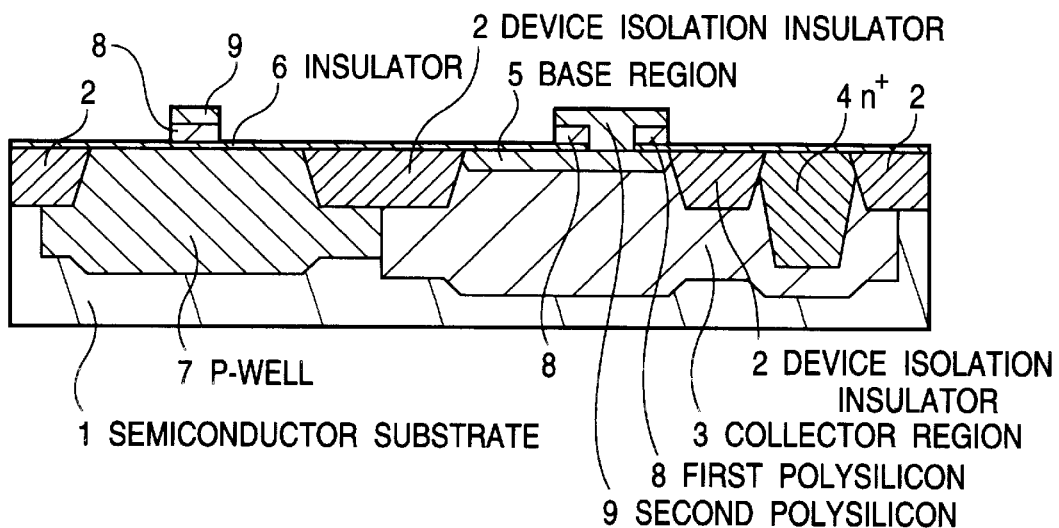
Figure 5A:
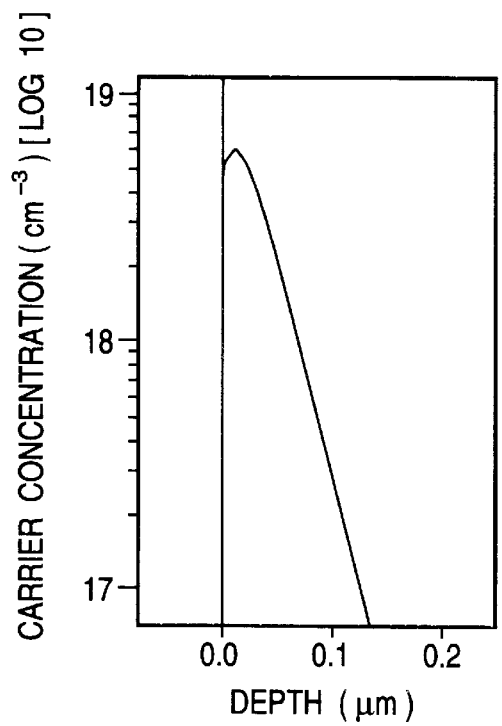
FIGS. 5A and 5B are graphs showing the relation between the carries concentration and the depth measured from the base region surface in the first prior art method in which the thermal oxidation for formation of the gate oxide film is carried out after the base region is formed.
Figure 5B:
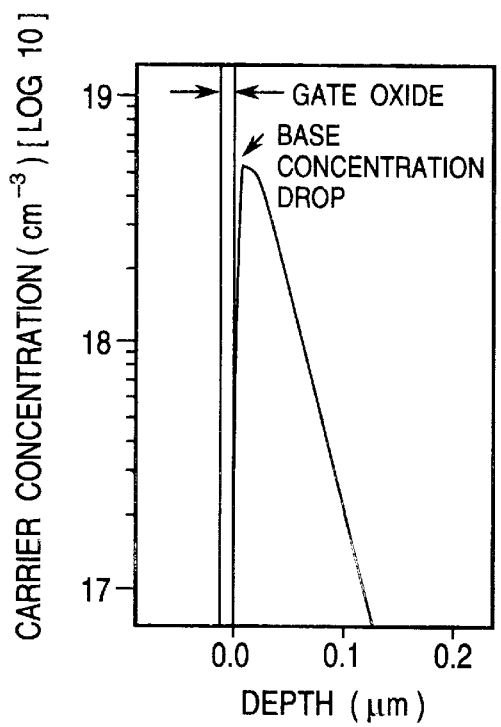
Figure 6:
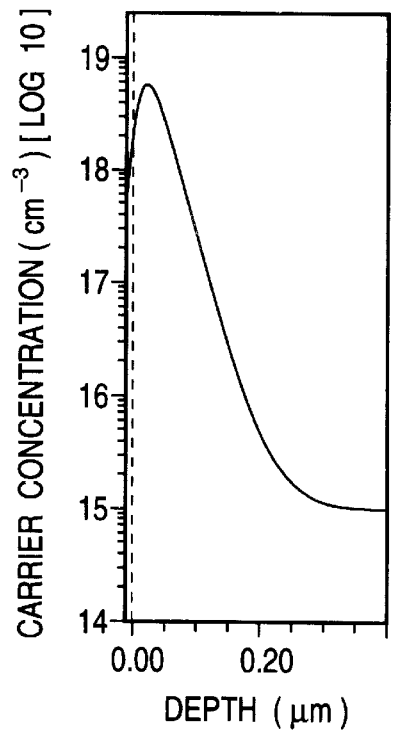
FIG. 6 is a graph showing the relation between the carrier concentration and the depth measured from the base region surface in the BiCMOS semiconductor device manufactured in accordance with the method of the present invention.
Figure 7:
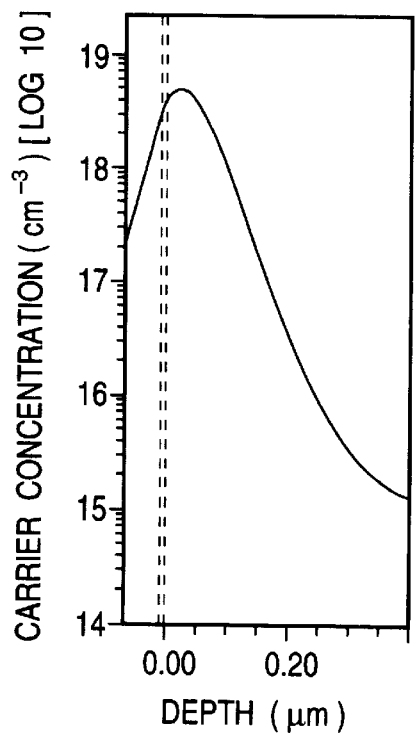
FIG. 7 is a graph showing the relation between the carrier concentration and the depth measured front the base region surface in the BiCMOS semiconductor device manufactured in accordance with the second prior an method in which the base region is formed after the first polysilicon film is formed.

Next, a second embodiment of the method in accordance with the present invention for manufacturing the BiCMOS semiconductor device will be described with reference to FIGS. 2A and 2B, which are diagrammatic sectional views of a semiconductor device for illustrating a portion of the second embodiment which is different from the first embodiment. In FIGS. 2A and 2B, elements similar to those shown in FIGS. 1A to 1I are given the same Reference Numerals, and explanation thereof will be omitted for simplification of the description.

The second embodiment of the method in accordance with the present invention for manufacturing the BiCMOS semiconductor is the same as the first embodiment, excluding the steps shown in FIGS. 2A and 2B.

Namely, similarly to the steps of the first embodiment shown in FIGS. 1A to 1D, on the semiconductor substrate 1, the device isolation insulator film (field oxide film) 2, the n$^+$ region 4 (which becomes the collector leading-out region of the high impurity concentration), the P-well 7, the insulating film 6 (which becomes the gate oxide), the first polysilicon film 8, the collector region 3, the base region 5 and the second polysilicon film 9 are formed in the order.

Thereafter, as shown in FIG. 2A, a patterned photoresist film 20 is formed on the second polysilicon film 9, and by using the patterned photoresist film 20 as a mask, the second polysilicon film 9 is selectively removed from a predetermined area (an emitter formation area) within the base region 5 to form an opening exposing the insulating film 6 in the predetermined area within the base region 5, and the insulating film 6 remaining in the opening exposing the predetermined area within the base region 5, is further removed.

Then, as shown in FIG. 2B, after the photoresist film 20 is removed, an n$^+$ polysilicon film 31 which is a polysilicon film doped with the n-type impurity at a high concentration, is formed on the whole principal surface of the semiconductor substrate 1 including the opening exposing the predetermined area within the base region 5. The n-type impurity of the n$^+$ polysilicon film 31 is As or P, and the impurity concentration of the n$^+$ polysilicon film 31 is required to be on the order of $5.0 \times 10^{19}/cm^3$ to $1.0 \times 10^{21}/cm^3$.

Thereafter, the steps of the first embodiment shown in FIGS. 1G to 1I are carried out, so that the BiCMOS semiconductor device as shown in FIG. 1I is obtained As seen from the above, the second embodiment is characterized in that the step of the first embodiment shown in FIG. 1F in which the third non-doped polysilicon film 21 is formed and the n-type impurity (As) is introduced into the third polysilicon film 21, is replaced with the direction formation of the polysilicon film (n⁺ polysilicon film) 31 doped with the n-type impurity at a high concentration.

As seen from the above, the BiCMOS semiconductor device manufacturing method in accordance with the present invention is characterized in that the gate electrode structure of the MOS transistor is constituted of a three-layered structure, and the bipolar transistor forming process is simply incorporated into the MOS transistor forming process in such a manner that after the oxidation for the formation of the gate oxide film the base region is formed by introducing the impurity through only the gate oxide film (thin oxide film) into the semiconductor substrate. As a result, without increasing the number of the masks, and without giving an adverse influence to the MOS transistor, the performance of the bipolar transistor can be elevated, and the stable yield of production can be realized. In addition, the microminiaturization of the bipolar transistor becomes possible.

Actually, according to the present invention, the performance of the bipolar transistor could be improved by about 50%, and the yield of production, which was on the order of 40% to 50%, could be improved to not less than 90%.

In addition, the leakage at the edge portion of the base region became zero, and a corresponding micromniaturzation became possible. Furthermore, if the polysilicon layer having a high concentration of n-type impurity is directly formed, this advantage was enhanced.

The invention has thus been shown and described with reference to the specific embodiments. However, it should be noted that the present invention is in no way limited to the details of the illustrated structures but changes and modifications may be made within the scope of the appended claims.

What is claimed is:

1. A method for manufacturing a BiCMOS semiconductor device including bipolar transistors and MOS transistors, including the steps of:

selectively forming a device isolation insulator film on a semiconductor substrate of a first conductivity type;

selectively forming in said semiconductor substrate a region of a second conductivity type opposite to the first conductivity type and a collector leading-out region of a bipolar transistor;

forming at least one well for a MOS transistor in said semiconductor substrate;

forming an insulating film on the whole surface of said semiconductor substrate including said well, and also forming a first polysilicon film on said insulating film;

selectively removing all of said first polysilicon film in a bipolar transistor formation area without substantially removing said insulating film in the bipolar transistor formation area and the first polysilicon film in a MOS transistor formation area;

forming a first region of said second conductivity type in said semiconductor substrate in said bipolar transistor formation area;

forming a second region of said first conductivity type in said first region of said second conductivity type;

forming a second polysilicon film on the whole surface of said semiconductor substrate including said first polysilicon film and said insulating film above said second region of said first conductivity type;

selectively removing said second polysilicon film and said insulating film above said second region of said first conductivity type, to form an opening exposing a predetermined area of said second region of said first conductivity type;

forming a third polysilicon film including impurity of said second conductivity type, on the whole surface of said semiconductor substrate including said second polysilicon film and said opening; and selectively removing said first, second and third polysilicon films so that said first, second and third polysilicon films are selectively left above said well, and said second and third polysilicon films are selectively left above said second region of said first conductivity type.

2. A method claimed in claim 1 wherein said third polysilicon film including impurity of said second conductivity type, is formed by forming a non-doped polysilicon film on the whole surface of said semiconductor substrate including said opening, and introducing impurity of said second conductivity type into said non-doped polysilicon film.

3. A method claimed in claim 2 wherein said second region of said first conductivity type is formed by introducing impurity of said first conductivity type into a surface region of said first region of said second conductivity type.

4. A method claimed in claim 3 wherein said first conductivity type is a p-type and said second conductivity type is an n-type, and said impurity of said first conductivity type introduced into said surface region of said first region of said second conductivity type is "B" or "BF₂".

5. A method claimed in claim 4 wherein said impurity of said second conductivity type introduced into said third polysilicon film is P (phosphorus) or As (arsenic).

6. A method claimed in claim 2 wherein said first conductivity type is a p-type and said second conductivity type is an n-type, and said impurity of said second conductivity type introduced into said third polysilicon film is P (phosphorus) or As (arsenic).

7. A method claimed in claim 1 wherein said third polysilicon film including impurity of said second conductivity type, is formed by depositing a polysilicon including impurity of said second conductivity type, on the whole surface of said semiconductor substrate including said opening, so that said third polysilicon film doped with said impurity of said second conductivity type is formed on the whole surface of said semiconductor substrate including said opening.

8. A method claimed in claim 7 wherein said first conductivity type is a p-type and said second conductivity type is an n-type, and said impurity of said second conductivity type introduced into said third polysilicon film is P (phosphorus) or As (arsenic).

9. A method claimed in claim 1 wherein said insulating film is formed by a thermal oxidation of the whole surface of said semiconductor substrate including said well, and wherein said first region of said second conductivity type is formed by selectively ion-implanting impurity of said second conductivity type into said semiconductor substrate in said bipolar transistor formation area through only said insulating film, and said second region of said first conductivity type is formed by selectively ion-implanting impurity of said first conductivity type into said first region of said second conductivity type through only said insulating film.

10. A method claimed in claim 1 wherein after the selective removal of said first, second and third polysilicon films, a beat treatment is carried out to cause impurity included in said third polysilicon film to thermally diffuse into said second region of said first conductivity type so that a third region of said second conductivity type is formed in a surface region of said second region of said first conductivity type.

11. A method for manufacturing a BiCMOS semiconductor device, comprising the steps of:

forming a device isolation film on a semiconductor substrate between a CMOS transistor region and a bipolar transistor region, forming a well in the CMOS transistor region;

forming a collector lead-out region in the bipolar transistor region;

forming an insulating film above the isolation film, the CMOS transistor region and the bipolar transistor region;

forming a first polysilicon film over an entire surface of the insulating film;

selectively removing all of the first polysilicon film above the bipolar transistor region without removing the first polysilicon film above the CMOS transistor region;

forming a collector region and a base region in the bipolar transistor region;

forming a second polysilicon film on the remaining first polysilicon film and on the insulating film above the bipolar transistor region;

forming an opening through the second polysilicon film and the insulating film above the bipolar transistor region;

forming a third polysilicon film on the second polysilicon film and in said opening; and selectively removing said first, second, and third polysilicon films so that said first, second, and third polysilicon films are left above the CMOS transistor region and said second and third polysilicon films are left above the bipolar transistor region.

* * * * *